US012241935B2

(12) United States Patent
Buescher

(10) Patent No.: US 12,241,935 B2
(45) Date of Patent: *Mar. 4, 2025

(54) REDUNDANT CONTACTORS WITH DATA-BASED PREVENTIVE MAINTENANCE REPLACEMENT INDICATORS

(71) Applicant: Copeland Comfort Control LP, St. Louis, MO (US)

(72) Inventor: Thomas P. Buescher, Webster Groves, MO (US)

(73) Assignee: Copeland Comfort Control LP, St. Louis, MO (US)

( * ) Notice: Subject to any disclaimer, the term of this patent is extended or adjusted under 35 U.S.C. 154(b) by 324 days.

This patent is subject to a terminal disclaimer.

(21) Appl. No.: 18/077,089

(22) Filed: Dec. 7, 2022

(65) Prior Publication Data

US 2023/0213582 A1 Jul. 6, 2023

Related U.S. Application Data

(60) Provisional application No. 63/296,146, filed on Jan. 3, 2022.

(51) Int. Cl.
*G01R 31/327* (2006.01)
*G08B 5/36* (2006.01)
*G08B 21/18* (2006.01)

(52) U.S. Cl.
CPC .......... *G01R 31/3278* (2013.01); *G08B 5/36* (2013.01); *G08B 21/185* (2013.01)

(58) Field of Classification Search
CPC ..... G01R 31/3278; G08B 5/36; G08B 21/185

USPC .......................................................... 340/664
See application file for complete search history.

(56) References Cited

U.S. PATENT DOCUMENTS

| | | | |
|---|---|---|---|
| 6,615,594 B2 | 9/2003 | Jayanth et al. | |
| 6,745,584 B2 | 6/2004 | Pham et al. | |
| 7,032,397 B1 | 4/2006 | Mueller et al. | |
| 7,298,148 B2 * | 11/2007 | Drake | G01R 31/3278 |
| | | | 361/170 |
| 7,672,095 B2 | 3/2010 | Drake et al. | |
| 7,752,853 B2 * | 7/2010 | Singh | F25B 49/02 |
| | | | 62/125 |
| D696,208 S | 12/2013 | Ling et al. | |
| D699,688 S | 2/2014 | Ling et al. | |
| 10,209,751 B2 | 2/2019 | Zikes et al. | |
| 10,475,612 B2 * | 11/2019 | Zhang | G01R 31/3278 |
| 2007/0205771 A1 * | 9/2007 | Drake | G01R 31/3278 |
| | | | 324/418 |
| 2008/0074215 A1 * | 3/2008 | Zhou | H01H 1/0015 |
| | | | 335/132 |
| 2020/0080740 A1 | 3/2020 | Broker | |

OTHER PUBLICATIONS

SureSwitch™ Multi-Volt Contactor; Emerson Electric Co., Copyright 2021; 8 pages.

* cited by examiner

*Primary Examiner* — Eric Blount
(74) *Attorney, Agent, or Firm* — Harness, Dickey & Pierce, P.L.C.; Anthony G. Fussner

(57) ABSTRACT

Exemplary embodiments are disclosed of contactors with data-based preventive maintenance replacement indicators and related methods for indicating that relay contact(s) should be replaced.

32 Claims, 4 Drawing Sheets

REDUNDANT CONTACTORS WITH DATA-BASED PREVENTIVE MAINTENANCE REPLACEMENT INDICATORS

CROSS-REFERENCE TO RELATED APPLICATION

This application claims the benefit of and priority to U.S. Provisional Application Ser. No. 63/296,146 filed Jan. 3, 2022. The entire disclosure of this provisional patent application is incorporated herein by reference.

FIELD

The present disclosure relates to redundant contactors with data-based preventive maintenance replacement indicators and related methods for indicating that relay contact(s) should be replaced.

BACKGROUND

This section provides background information related to the present disclosure which is not necessarily prior art.

Climate control systems typically include components such as compressors that are turned on and off by contactors in response to thermostat signals. It is typical in critical applications, like food storage or retail, to replace contactors at specific intervals according to a replacement schedule to guard against losses due to failure of the component.

DRAWINGS

The drawings described herein are for illustrative purposes only of selected embodiments and not all possible implementations and are not intended to limit the scope of the present disclosure.

Corresponding reference numerals may indicate corresponding (though not necessarily identical) features throughout the several views of the drawings.

DETAILED DESCRIPTION

Figure 1:
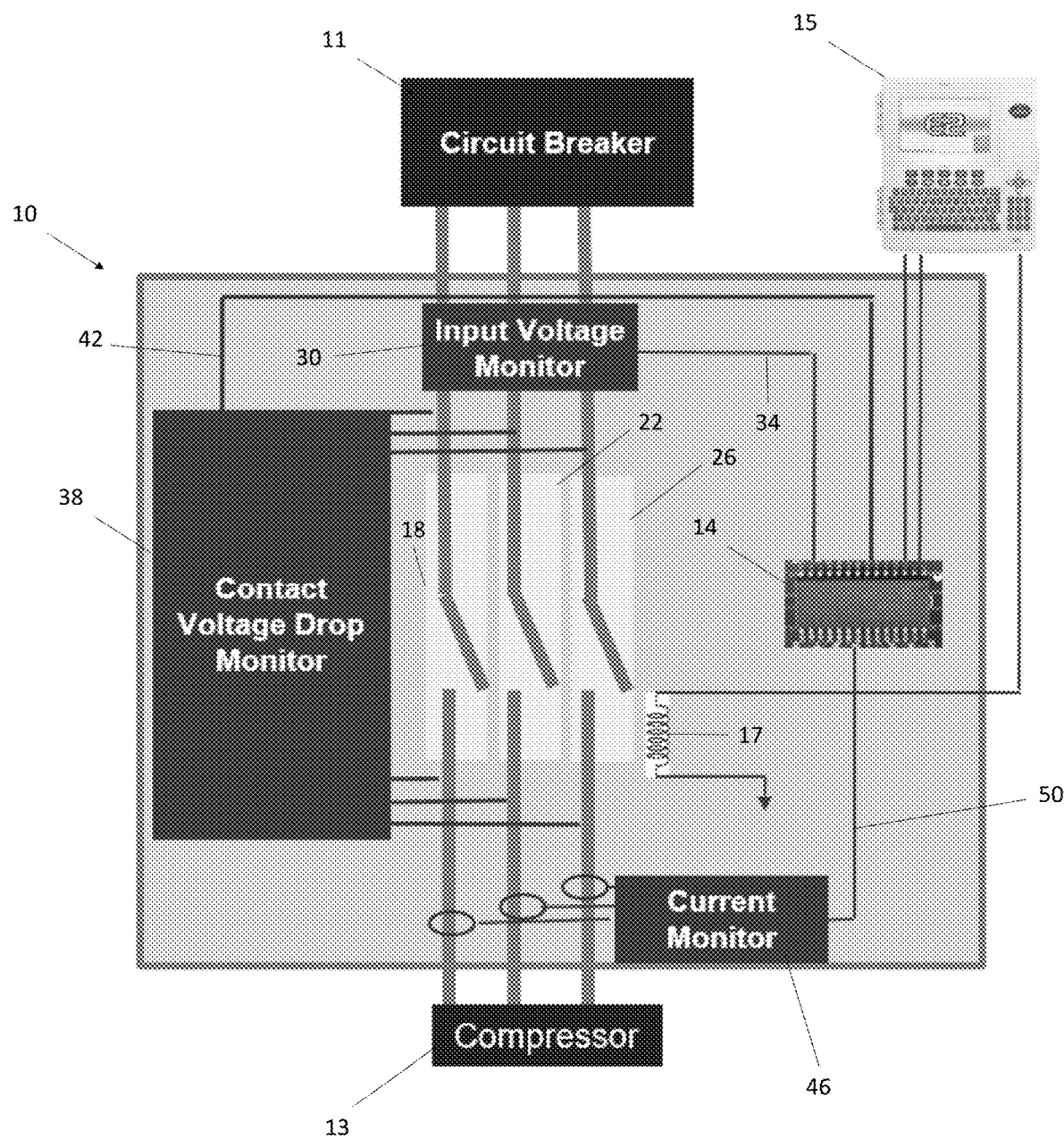
FIG. 1 is a diagram illustrating an exemplary embodiment of a redundant contactor with data-based preventive maintenance replacement indicator(s) for indicating that relay contact(s) should be replaced.

Example embodiments will now be described more fully with reference to the accompanying drawings.

In exemplary embodiments disclosed herein, a relay switch control or contactor includes a microcontroller and three independent relays. The microcontroller is configured to be operable for independently switching the three independent relays ON or OFF. The microcontroller is also configured to be operable for detecting and measuring voltage across each relay to determine whether or not the contacts of the relays are open or closed.

A three-phase load may be turned off by switching two of the three phases OFF. By having three relays and feedback regarding the open or closed positions of the three relays, the relay switch control or contactor is able to provide single level redundancy for a relay failure as disclosed herein.

In the case of one relay contact being stuck "ON" after the three relays have been de-energized, there will be a significantly lower voltage drop across the stuck ON relay contact as compared to the other two relay contacts. By way of example, the significantly lower voltage drop across the stuck ON relay may be less than half of peak voltage of the other two relay contacts or phases. And the significantly lower voltage drop across the stuck ON relay contact is detectable by the microcontroller. Because a three-phase load can be switched OFF by switching two of the three relay contacts OFF, the load can still be switched off and will not fail due to overheating by single phasing when one relay contact is stuck ON.

After the microcontroller has detected the significantly lower voltage drop across the stuck ON relay contact, the microcontroller will not energize the load until the relay switch control or contactor has been reset. For example, if the voltage drop returned to the normal range, the relay switch control or contactor may be manually reset or automatically reset. But if the voltage drop remains out of range, the relay switch control or contactor may be operated manually by a test button or by a special override signal on the coil input.

The microcontroller may also be configured to alert the system controller. For example, the microcontroller may be configured to send an alert providing information about the stuck ON relay contact to a thermostat (broadly, a controller) of a climate control system (e.g., HVAC system, cold chain system, etc.) after the microcontroller has detected the significantly lower voltage drop across the stuck ON relay contact after the three relays have been de-energized.

In the case of one relay contact being stuck "OFF" after the relays are energized, there will be a significantly higher voltage drop across the stuck OFF relay contact as compared to the other two relay contacts. For example, there may be a significantly higher voltage drop greater than 20V across the stuck OFF relay contact after the relays are energized.

And the significantly higher voltage drop across the stuck OFF relay contact is detectable by the microcontroller. Because a three-phase load can be switched OFF by switching two of the three relay contacts OFF, the load can be switched off and will not fail due to overheating by single phasing when the one relay contact is stuck OFF. After the microcontroller has detected the significantly higher voltage drop across the stuck OFF relay contact, the microcontroller will not energize the load until the relay switch control or contactor has been reset. The microcontroller may also be configured to alert the system controller. For example, the microcontroller may be configured to send an alert providing information about the stuck OFF relay contact to a thermostat (broadly, a controller) of a climate control system (e.g., HVAC system, cold chain system, etc.) after the microcontroller has detected the significantly higher voltage drop across the stuck OFF relay contact.

In an exemplary embodiment, the relay switch control or contactor includes one or more light emitting diodes (LEDs) along a portion of a housing of the relay switch control or contactor. Light from the one or more LEDs is visible to display the fault condition of a relay switch not operating properly.

By way of example only, one or more (but not necessarily any or all) of the following features, functions, and benefits may be provided by exemplary embodiments of the relay switch controls or contactors and related methods disclosed herein. Exemplary embodiments may be configured to have redundancy and to alert a controller of a shutdown event. Exemplary embodiments may provide compressor protection that helps prevent the loss of a compressor, which tends to be an expensive component to replace with relatively high material and labor costs. Exemplary embodiments may eliminate the need for preventive replacement of relay contacts based on specific time intervals, thereby reducing labor and material costs associated with unnecessary or premature replacements of working relay contacts based on a replacement schedule. Exemplary embodiments may be configured to have adaptive data-based preventive maintenance alerting, thereby eliminating the need for time based preventive maintenance (e.g., replacement at specific intervals based on a replacement schedule, etc.) and/or extending the preventive maintenance intervals for lower load rated contactors.

With reference now to the figures, FIG. 1 illustrates an exemplary embodiment of a relay control or contactor 10 embodying one or more aspects of the present disclosure is indicated. The contactor 10 is configured with data-based preventive maintenance replacement indicator(s) for indicating or alerting that relay contact(s) should be replaced. As shown in FIG. 1, the contactor 10 is connected with a circuit breaker 11, a compressor 13, and a thermostat 15 (broadly, a controller) of a climate control system (e.g., HVAC system, a cold chain system, etc.).

The contactor 10 includes a microcontroller 14 (broadly, a processor). The microcontroller 14 is coupled for communication with the thermostat 15. For example, the microcontroller 14 may receive control signals from the thermostat 15 via Y and C terminals. The microcontroller 14 may include a memory, e.g., a non-volatile electrically erasable programmable read-only memory (EEPROM), etc.

The contactor 10 includes first, second, and third relays 18, 22, and 26 having respective first, second, and third contacts, which are shown in their open positions in FIG. 1. The thermostat 15 is connected with an electromagnetic coil 17 for opening and closing the contacts of the first, second, and third relays 18, 22, and 26. The contacts are opened and closed by exciting the electromagnetic coil 17.

The relays 18, 22, and 26 are electrically connected with a motor of the compressor 13 (broadly, a load) and the circuit breaker 11 (broadly, a voltage input from a line voltage source). The microcontroller 14 is configured to be operable for independently switching the relays 18, 22, 26 ON or OFF. For example, the microcontroller 14 may open the contacts of the relays 18, 22, and 26 to electrically disconnect the circuit breaker 11 from the motor of the compressor 13. Or the microcontroller 14 may close the contacts of the relays 18, 22, and 26 to electrically connect the circuit breaker 11 to the motor of the compressor 13. Each relay 18, 22, and 26 may be substantially enclosed in a seal, e.g., a coating of epoxy glue, configured to prevent the intrusion, e.g., of insects and debris into contacts of the relays 18, 22, and 26, etc.

An input voltage monitor 30 is electrically connected with the voltage input into each relay 18, 22, and 26. The input voltage monitor 30 is operable for monitoring the input voltage to the relays 18, 22, and 26. The input voltage monitor 30 is in communication with the microcontroller 14 via communication path 34. Accordingly, the microcontroller 14 receives the input voltages of the relays 18, 22, and 26 from the input voltage monitor 30 via communication path 34.

A contact voltage drop monitor 38 is electrically connected with the voltage input and voltage output of each relay 18, 22, and 26. The contact voltage drop monitor 38 is operable for monitoring the voltage across each relay 18, 22, and 26 from its voltage input to its voltage output. The contact voltage drop monitor 38 is in communication with the microcontroller 14 via communication path 42. Accordingly, the microcontroller 14 receives feedback or information about the voltages (e.g., voltage drops, etc.) across the relays 18, 22, and 26 from the contact voltage drop monitor 38 via communication path 42. The microcontroller 14 may then use the voltages across the relays 18, 22, 26 to determine whether or not the contacts of the relays 18, 22, 26 are open or closed.

A current monitor or sensor 46 is electrically connected with the voltage output from each relay 18, 22, and 26. The current monitor 46 is operable for monitoring the current between the compressor 13 and each relay 18, 22, and 26. The current monitor 46 is in communication with the microcontroller 14 via communication path 50. Accordingly, the microcontroller 14 receives feedback or information about the current between the compressor 13 and each relay 18, 22, and 26 from the current monitor 46 via communication path 50.

By having three relays 18, 22, and 26 and voltage feedback via the contact voltage drop monitor 38 regarding the open or closed positions of the three relays 18, 22, and 26, the contactor 10 is able to provide a single level redundancy for a relay failure as explained herein.

In the case of one relay contact being stuck "ON" after the relays 18, 22, 26, have been de-energized, the microcontroller 14 via the contact voltage drop monitor 38 will detect a significantly lower voltage drop across the stuck ON relay contact as compared to the other two relay contacts. Because a three-phase load can be switched OFF by switching two of the three relay contacts OFF, the compressor 13 (broadly, a load) can still be switched off and will not fail due to overheating by single phasing when the one relay contact is stuck ON. After the microcontroller 14 has detected the significantly lower voltage drop across the stuck ON relay contact, the microcontroller 14 is configured so as to not energize the load until the contactor 10 has been reset. For example, if the voltage drop returned to the normal range, the contactor 10 may be manually reset or automatically reset. But if the voltage drop remains out of range, the contactor 10 may be operated manually by a test button or by a special override signal on the coil input. The microcontroller 14 is also configured to alert the thermostat 15 (broadly, a controller of a climate control system) after the microcontroller 14 has detected the significantly lower voltage drop across the stuck ON relay contact.

In the case of one relay contact being stuck "OFF" after the relays 18, 22, 26 are energized, the microcontroller 14 via the contact voltage drop monitor 38 will detect a significantly higher voltage drop across the stuck OFF relay contact as compared to the other two relay contacts. Because a three-phase load can be switched OFF by switching two of the three relay contacts OFF, the compressor 13 can be switched off and will not fail due to overheating by single phasing when the one relay contact is stuck OFF. After the microcontroller 14 has detected the significantly higher voltage drop across the stuck OFF relay contact, the microcontroller 14 is configured so as to not energize the load until the contactor 10 has been reset. The microcontroller 14 is also configured to alert the thermostat 15 after the microcontroller 14 has detected the significantly lower voltage drop across the stuck ON relay contact.

The current monitor 46 is electrically connected with the three relays 18, 22, and 26 and the microcontroller 14. The microcontroller 14 is configured to be operable for determining the current and estimated power factor of the switch load. The current and the estimated power factor are significant factors in the life of relay contacts.

Estimated relay contact cycle life for multiple inductive load levels may be determined, e.g., empirically developed, etc. The replacement thresholds for different load levels may be stored in memory (e.g., a non-volatile electrically erasable programmable read-only memory (EEPROM), etc.) of the microcontroller 14.

The microcontroller 14 is configured to keep a cycle count and store the cycle count in memory (e.g., a non-volatile electrically erasable programmable read-only memory (EEPROM), etc.) of the microcontroller 14. The microcontroller 14 is configured to compare the cycle count with a threshold for the connected load level. If the microcontroller 14 determines that the cycle count equals or exceeds the threshold for the connected load level, then the microcontroller 14 will generate an alert or indicator.

Figure 4:
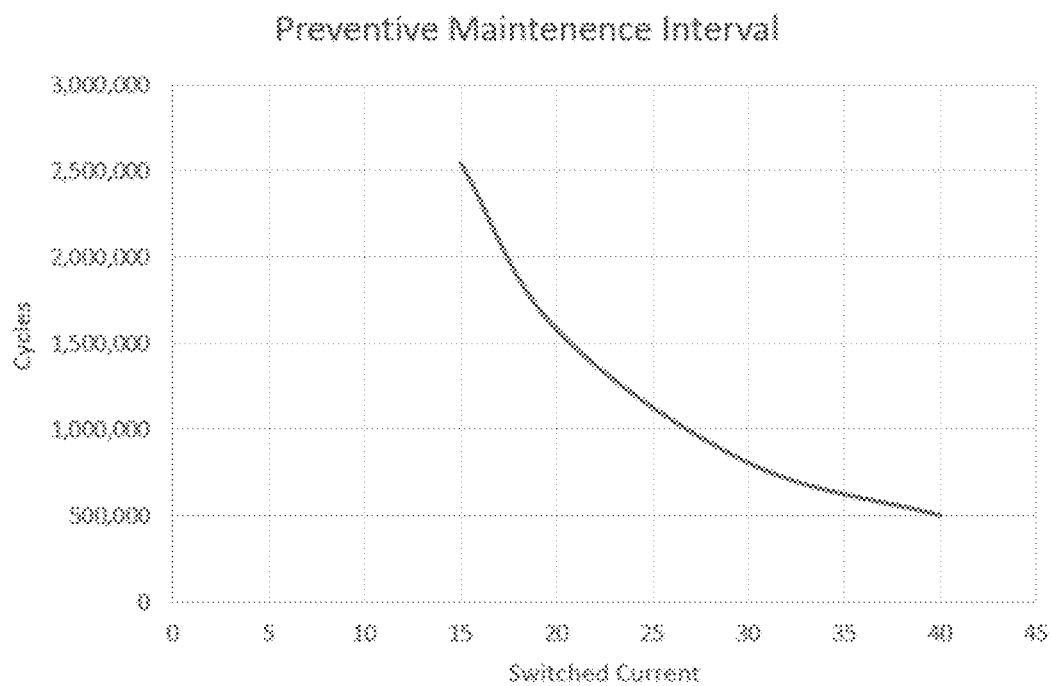
FIG. 4 is preventive maintenance interval line graph of cycles versus switched current. The data shown in FIG. 4 may be used by a contactor for providing adaptive preventive maintenance contactor replacement alerting and/or indicators according to an exemplary embodiment.

For example, the microcontroller 14 may send an alert to the thermostat 15 when the microcontroller 14 determines that the cycle count equals or exceeds the threshold for the connected load level. Or, for example, the contactor 10 may also or alternatively include one or more light sources (broadly, an indicator) that illuminate when the microcontroller 14 determines that the cycle count equals or exceeds the threshold for the connected load level. The light from the one or more light sources indicates or alerts the user that preventive maintenance contactor replacement is due. Accordingly, the contactor 10 is configured with adaptive preventive maintenance contactor replacement alerting and/or indicators, which is based on data instead of being solely based on specific time intervals according to a replacement schedule. For example, the contactor 10 may be configured with adaptive preventive maintenance contactor replacement alerting and/or indicators that is based on a determination that a cycle count equals or exceeds the threshold for a connected load level. See, for example, the preventive maintenance interval line graph shown in FIG. 4 of cycles versus switched current.

By way of example, the contactor 10 may include one or more features of the relay switch control disclosed in U.S. Pat. No. 10,209,751. The entire disclose of U.S. Pat. No. 10,209,751 is incorporated herein by reference.

Figure 2:
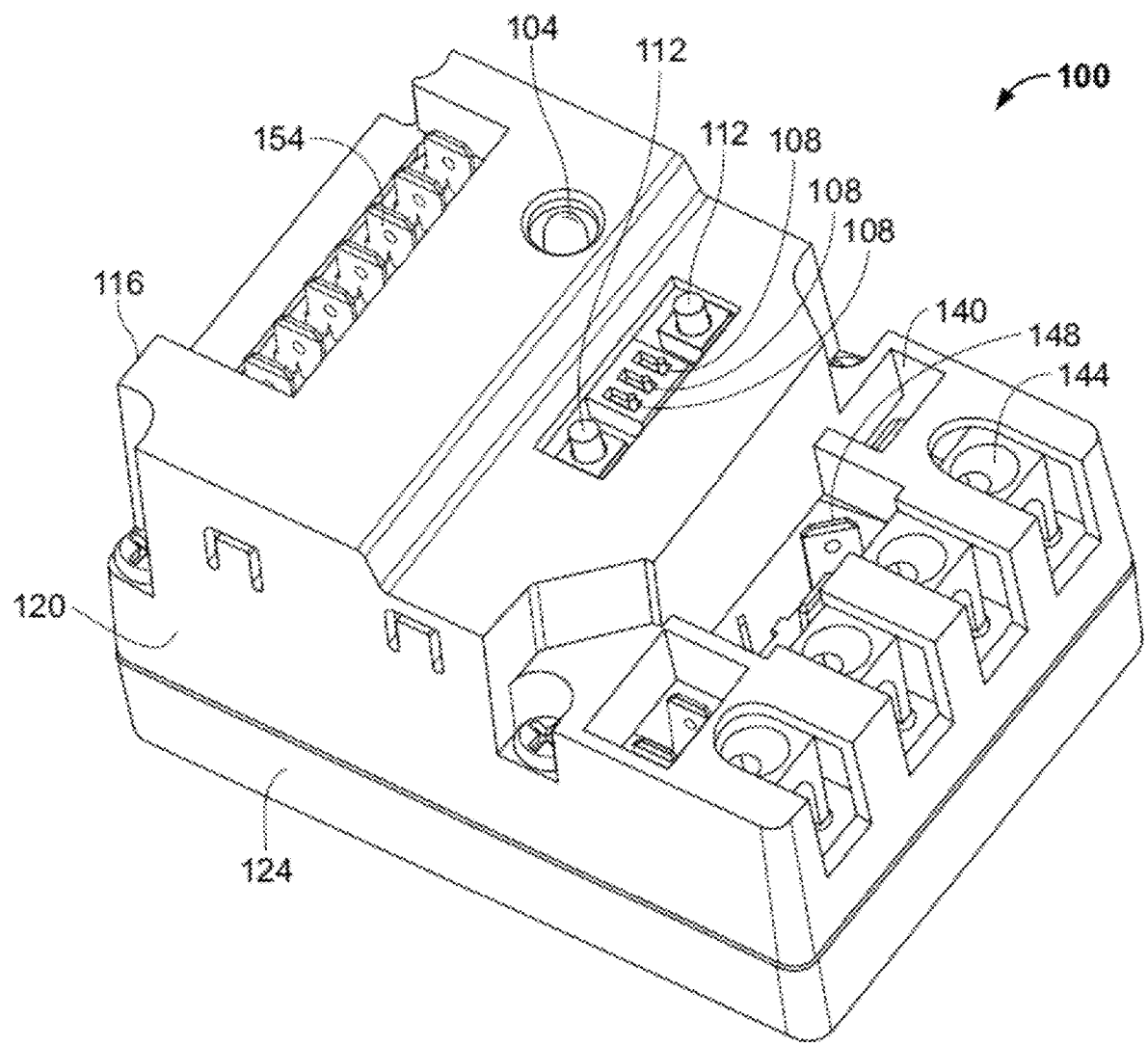
FIG. 2 is a perspective view of a relay switch control that may include the redundant contactor shown in FIG. 1 according to an exemplary embodiment.
Figure 3:
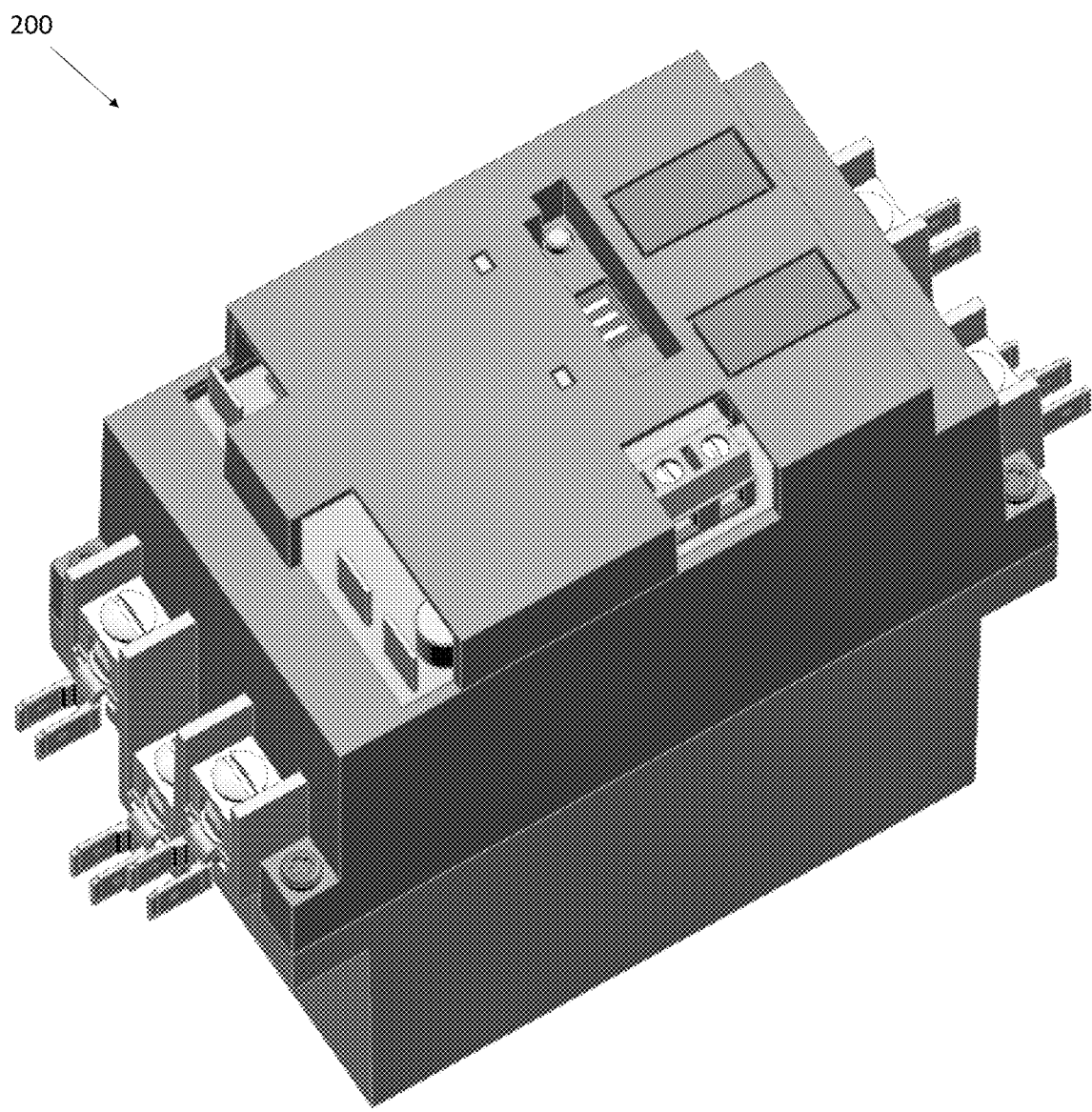
FIG. 3 is a perspective view of a relay switch control that may include the redundant contactor shown in FIG. 1 according to an exemplary embodiment.

For example, the contactor 10 shown in FIG. 1 may comprise one or more features of the relay switch control 100 (broadly, a control) shown in FIG. 2. As another example, the contactor 10 shown in FIG. 1 may comprise one or more features of the relay switch control 200 (broadly, a control) shown in FIG. 3.

With reference back to FIG. 2, the example relay switch control 100 includes an indicator light 104, e.g., a multi-color LED, etc. The control 100 includes three dipswitches 108 and two push buttons 112.

The control 100 includes a two-piece housing 116, e.g., a two-piece plastic housing with integral mounting features. The two-piece housing 116 includes an upper housing portion or cover 120 and a lower housing portion 124. The microprocessor and three relays are provided beneath the upper cover 120 and so are not visible in FIG. 2. The housing 116 includes openings 140 in the upper housing portion or cover 120 for the terminal connections and connections to a compressor and a fan. Lug connectors 144 are provided for line voltage inputs and compressor outputs. Connectors 148 are provided for connection of compressor and fan capacitors, fan, etc. to line voltages (L1, L2).

The microprocessor and relays may be provided on a printed circuit board (PCB), which is horizontally situated relative to the housing bottom portion 124. But the PCB could be oriented in other directions, e.g., vertically within the housing in other relay switch control embodiments. Connectors 154 are provided on the PCB for connection of the control 100 with a thermostat (broadly, a controller).

The control 100 may be self-powered and/or may be configured with a power stealing feature in exemplary embodiments. In various embodiments, the control 100 may include its own 24 VAC power such that an installer is not required to pull additional wires to the outdoor unit.

Disclosed herein are exemplary embodiments of a relay control/contactor comprising three independent relay operators and configured with feedback (e.g., voltage feedback and/or current feedback) to enable responding to a failure condition in which the contact(s) fail to make an electrical connection (a stuck OFF relay) or fail to break an electrical connection (a stuck ON relay). In exemplary embodiments, voltage feedback is used to enable a response to a failure in the contact(s) to make or break an electrical connection.

In other exemplary embodiments, current feedback is used in addition to or as an alternative to the voltage feedback. In such exemplary embodiments, at least one current sensor (e.g., a single current sensor, more than one current sensor, etc.) may be used for determining whether there is a current across a relay. If there is no current across the relay, then the relay is open and the motor is only running on two phases and the motor should be shut down. If current is at lock rotor current for an amount of time (e.g., 3 to 4 times longer than typical, more than 10 seconds, other suitable time period, etc.), then the motor could be running on two phases and should be shut down. By way of example, the current sensor may comprise at least one low resolution current sensor, current monitor, or current transformer having relatively low resolution circuitry that is sufficient for the relatively large differentials between no current, run current, and locked rotor current. Also, by way of example, exemplary embodiments may include a single current sensor for determining whether there is a current across first, second, and third relays. Or, for example, other exemplary embodiments may include first, second, and third current sensors for respectively determining whether this is a current across first, second, and third relays.

In exemplary embodiments, a relay control or contactor comprises a processor and first, second, and third relays. The first, second, and third relays include respective first, second, and third relay contacts and are independently operable by the processor to electrically connect or disconnect a load to or from a voltage input. The processor is configured to determine voltage across each said first, second, and third relay to thereby determine the open or closed positions of each said first, second, and third relay contact, respectively. The processor is configured to determine a relay failure condition when: a voltage drop across at least one of the first, second, and third relays is lower than a voltage drop across at least one other of the first, second, and third relays after the first, second, and third relays are de-energized; or a voltage drop across at least one of the first, second, and third relays is higher than a voltage drop across at least one other of the first, second, and third relays after the first, second, and third relays are energized.

In exemplary embodiments, the processor is configured to determine a failure condition of the first relay when: a voltage drop across the first relay is significantly lower than voltage drops across the second and third relays after the first, second, and third relays are de-energized; or a voltage drop across the first relay is significantly higher than voltage drops across the second and third relays after the first, second, and third relays are energized.

In exemplary embodiments, the processor is configured to determine a failure condition of the first relay when a voltage drop across the first relay is less than half of peak voltage of the second and third relays after the first, second, and third relays are de-energized.

In exemplary embodiments, the processor is configured to determine a failure condition of the first relay when a voltage drop across the first relay is greater than 20V as compared to the second and third relays when the first, second, and third relays are energized.

In exemplary embodiments, the processor is configured to determine that a relay contact of the at least one of the first, second, and third relays is stuck ON when the voltage drop across the at least one of the first, second, and third relays is lower than the voltage drop across the at least one other of the first, second, and third relays after the first, second, and third relays are de-energized. And the processor is configured to determine that a relay contact of the at least one of the first, second, and third relays is stuck OFF when the voltage drop across the at least one of the first, second, and third relays is higher than the voltage drop across the at least one other of the first, second, and third relays after the first, second, and third relays are energized.

In exemplary embodiments, after the processor has determined a relay failure condition exists, the processor is configured to not energize the load until the contactor is reset.

In exemplary embodiments, after the processor has determined that a relay failure condition exists, the processor is configured to alert a system controller and/or a user about the relay failure condition.

In exemplary embodiments, the contactor includes at least one light source. And the processor is configured to control operation of the at least one light source to illuminate and thereby generate an alert after the processor has determined that a relay failure condition exists.

In exemplary embodiments, the contactor includes a contact voltage drop monitor electrically connected with the voltage input and voltage output of each said first, second, and third relay, such that the contact voltage drop monitor is operable for monitoring the voltage across each said first, second, and third relay. And the contact voltage drop monitor is in communication with the processor for providing the processor with information about the voltage drops across the first, second, and third relays.

In exemplary embodiments, the contactor includes a current monitor electrically connected with the first, second, and third relays. And the current monitor is in communication with the processor for providing the processor with information about current from the first, second, and third relays to the load.

In exemplary embodiments, the processor is configured to keep and compare a cycle count for the first, second, and third relays to a replacement threshold of estimated relay contact cycle life for the connected load level and to generate an alert if the cycle count for the first, second, and third relays (e.g., a cycle count for the total number of make/break combinations or switch cycles, etc.) equals or exceeds the replacement threshold for the connected load level. The processor may be configured to access replacement thresholds of estimated relay contact cycle life for different load levels to obtain the replacement threshold of estimated relay contact cycle life for the connected load level for comparison to the cycle count. The processor may be configured to control operation of at least one light source to illuminate if the cycle count for the first, second, and third relays equals or exceeds the replacement threshold for the connected load level.

In exemplary embodiments, a system comprises a controller in communication with the processor of the contactor as disclosed herein. The processor is configured to receive control signals from the controller. The first, second, and third relays are operable by the processor in response to control signals from the controller to electrically connect or disconnect the load to or from the voltage input received by the contactor from a line voltage source. After the processor has determined that a relay failure condition exists, the processor is configured to send an alert to the controller about the relay failure condition.

In exemplary embodiments, a system comprises a thermostat in communication with the processor of the contactor as disclosed herein. The system also includes a compressor including a motor. The processor is configured to receive control signals from the thermostat. The first, second, and third relays are operable by the processor in response to control signals from the thermostat to electrically connect or disconnect the motor of the compressor to or from the voltage input received by the contactor from a line voltage source. After the processor has determined that a relay failure condition exists, the processor is configured to send an alert to the thermostat about the relay failure condition.

In exemplary embodiments, a relay control or contactor comprises a processor and first, second, and third relays. The first, second, and third relays include respective first, second, and third relay contacts and are independently operable by the processor to electrically connect or disconnect a load to or from a voltage input. The processor is configured to determine a relay failure condition when: after the first, second, and third relays are energized, there is no current across at least one of the first, second, and third relays indicating that the at least one of the first, second, and third relays is open and the load is running on two phases; or after the first, second, and third relays are energized, the current across at least one of the first, second, and third relays is at lock rotor current for more than a predetermined amount of time indicating that the load is running on two phases.

In exemplary embodiments, the contactor includes at least one current sensor electrically connected with at least one of the first, second, and third relays. And the at least one current sensor is in communication with the processor for providing the processor with information about current from the at least one of the first, second, and third relays to the load.

In exemplary embodiments, the contactor includes first, second, and third current sensors electrically connected with the respective first, second, and third relays. And the first, second, and third current sensors are in communication with the processor for providing the processor with information about current from the first, second, and third relays to the load.

In exemplary embodiments, after the processor has determined a relay failure condition exists, the processor is configured to de-energize the load and not energize the load until the contactor is reset.

Also disclosed are exemplary methods of providing adaptive data-based preventive maintenance alerting. In exemplary embodiments, the method comprises maintaining a cycle count for at least one relay of a contactor; comparing the cycle count for the at least one relay with a replacement threshold of estimated relay contact cycle life for a connected load level of the at least one relay; and generating an alert if it is determined that the cycle count for the at least one relay equals or exceeds the replacement threshold of estimated relay contact cycle life for the connected load level of the at least one relay.

In exemplary embodiments, the at least one relay of the contactor comprises first, second, and third relays configured to be operable by a processor of the contactor to electrically connect or disconnect a load to or from a voltage input. And the method includes: maintaining and comparing, via the processor, a cycle count for the first, second, and third relays (e.g., a cycle count for the total number of make/break combinations or switch cycles, etc.) to a replacement threshold of estimated relay contact cycle life for the connected load level; and generating, via the processor, an alert if it is determined that the cycle count for the first, second, and third relays equals or exceeds the replacement threshold of estimated relay contact cycle life for the connected load level.

In exemplary embodiments, the method includes accessing, via the processor, replacement thresholds of estimated relay contact cycle life for different load levels to thereby obtain the replacement threshold of estimated relay contact cycle life for the connected load level for comparison to the cycle count.

In exemplary embodiments, the method includes empirically developing estimated relay contact cycle life for multiple inductive load levels.

In exemplary embodiments, generating an alert comprises sending an alert to a thermostat if it is determined that the cycle count for the at least one relay equals or exceeds the replacement threshold of estimated relay contact cycle life for the connected load level of the at least one relay.

In exemplary embodiments, generating an alert comprises controlling operation of at least one light source to illuminate if it is determined that the cycle count for the at least one relay equals or exceeds the replacement threshold of estimated relay contact cycle life for the connected load level of the at least one relay.

In exemplary embodiments, the method includes providing adaptive data-based preventive maintenance contactor replacement alerting that is independent from or not solely based on specific time intervals according to a replacement schedule.

Also disclosed are exemplary contactors configured to be operable for providing adaptive data-based preventive maintenance alerting. In exemplary embodiments, the contactor comprise a processor and first, second, and third relays. The first, second, and third relays include respective first, second, and third relay contacts and configured to be operable by the processor to electrically connect or disconnect a load to or from a voltage input. The processor is configured to: maintain and compare a cycle count for the first, second, and third relays (e.g., a cycle count for the total number of make/break combinations or switch cycles, etc.) to a replacement threshold of estimated relay contact cycle life for a connected load level; and generate an alert if it is determined that the cycle count for the first, second, and third relays equals or exceeds the replacement threshold of estimated relay contact cycle life for the connected load level.

In exemplary embodiments, the processor is configured to access replacement thresholds of estimated relay contact cycle life for different load levels to thereby obtain the replacement threshold of estimated relay contact cycle life for the connected load level for comparison to the cycle count.

In exemplary embodiments, the processor is configured to empirically develop estimated relay contact cycle life for multiple inductive load levels.

In exemplary embodiments, the contactor is configured to be operable for providing adaptive data-based preventive maintenance contactor replacement alerting that is independent from or not solely based on specific time intervals according to a replacement schedule.

In exemplary embodiments, a system comprises a controller in communication with the processor of the contactor. The processor is configured to receive control signals from the controller. The first, second, and third relays are operable by the processor in response to control signals from the controller to electrically connect or disconnect the load to or from the voltage input received by the contactor from a line voltage source. The processor is configured to send an alert to the controller if the processor determines that the cycle count for the first, second, and third relays equals or exceeds the replacement threshold of estimated relay contact cycle life for the connected load level.

In exemplary embodiments, a system comprises a thermostat in communication with the processor of the contactor, and a compressor including a motor. The processor is configured to receive control signals from the thermostat. The first, second, and third relays are operable by the processor in response to control signals from the thermostat to electrically connect or disconnect the motor of the compressor to or from the voltage input received by the contactor from a line voltage source. The processor is configured to send an alert to the thermostat if the processor determines that the cycle count for the first, second, and third relays equals or exceeds the replacement threshold of estimated relay contact cycle life for the connected load level.

Although various exemplary embodiments are described herein in relation to a compressor motor and a thermostat, the disclosure is not so limited. Various embodiments are contemplated in relation to various types of loads (including but not limited to motors) that may be switched through contactors and relay switch controls including relays having contacts. Embodiments of contactors and relay switch controls also are contemplated in relation to various types of systems, including but not limited to climate control systems, HVAC systems, cold chain systems, refrigeration systems, etc. Although the term "relay switch control" is used herein, it is contemplated that various types of controls, controllers, hardware, software, combinations thereof, etc. could be used. It also is contemplated that various types of processors, microprocessors, computers, etc. could be utilized in accordance with various implementations of the disclosure.

Example embodiments are provided so that this disclosure will be thorough and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail.

The terminology used herein is for the purpose of describing particular example embodiments only and is not intended to be limiting. As used herein, the singular forms "a", "an" and "the" may be intended to include the plural forms as well, unless the context clearly indicates otherwise.

The terms "comprises," "comprising," "includes," "including," "has," "have," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

When an element or layer is referred to as being "on", "engaged to", "connected to" or "coupled to" another element or layer, it may be directly on, engaged, connected, or coupled to the other element or layer, or intervening elements or layers may be present. In contrast, when an element is referred to as being "directly on," "directly engaged to", "directly connected to" or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

The term "about" when applied to values indicates that the calculation or the measurement allows some slight imprecision in the value (with some approach to exactness in the value; approximately or reasonably close to the value; nearly). If, for some reason, the imprecision provided by "about" is not otherwise understood in the art with this ordinary meaning, then "about" as used herein indicates at least variations that may arise from ordinary methods of measuring or using such parameters. For example, the terms "generally", "about", and "substantially" may be used herein to mean within manufacturing tolerances.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer, or section. Terms such as "first," "second," and other numerical terms when used herein do not imply a sequence or order unless clearly indicated by the context. Thus, a first element, component, region, layer, or section discussed below could be termed a second element, component, region, layer, or section without departing from the teachings of the example embodiments.

Spatially relative terms, such as "inner," "outer," "beneath", "below", "lower", "above", "upper" and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The foregoing description of the embodiments has been provided for purposes of illustration and description. It is not intended to be exhaustive or to limit the disclosure. Individual elements, intended or stated uses, or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

What is claimed is:

1. A contactor comprising:
    a processor; and
    first, second, and third relays including respective first, second, and third relay contacts and configured to be operable by the processor to electrically connect or disconnect a load to or from a voltage input;
    wherein the processor is configured to determine a relay failure condition when:
        a voltage drop across at least one of the first, second, and third relays is lower than a voltage drop across at least one other of the first, second, and third relays after the first, second, and third relays are de-energized; or
        a voltage drop across at least one of the first, second, and third relays is higher than a voltage drop across at least one other of the first, second, and third relays after the first, second, and third relays are energized.

2. The contactor of claim 1, wherein the processor is configured to determine a failure condition of the first relay when:
    a voltage drop across the first relay is significantly lower than voltage drops across the second and third relays after the first, second, and third relays are de-energized; or
    a voltage drop across the first relay is significantly higher than voltage drops across the second and third relays after the first, second, and third relays are energized.

3. The contactor of claim 1, wherein the processor is configured to determine a failure condition of the first relay when a voltage drop across the first relay is less than half of peak voltage of the second and third relays after the first, second, and third relays are de-energized.

4. The contactor of claim 1, wherein the processor is configured to determine a failure condition of the first relay when a voltage drop across the first relay is greater than 20V as compared to the second and third relays when the first, second, and third relays are energized.

5. The contactor of claim 1, wherein the processor is configured to determine a failure condition of the first relay when:
    a voltage drop across the first relay is less than half of peak voltage of the second and third relays after the first, second, and third relays are de-energized; or
    a voltage drop across the first relay is greater than 20V as compared to the second and third relays when the first, second, and third relays are energized.

6. The contactor of claim 1, wherein:
    the processor is configured to determine that a relay contact of the at least one of the first, second, and third relays is stuck ON when the voltage drop across the at least one of the first, second, and third relays is lower than the voltage drop across the at least one other of the first, second, and third relays after the first, second, and third relays are de-energized; and
    the processor is configured to determine that a relay contact of the at least one of the first, second, and third relays is stuck OFF when the voltage drop across the at least one of the first, second, and third relays is higher than the voltage drop across the at least one other of the first, second, and third relays after the first, second, and third relays are energized.

7. The contactor claim 1, wherein after the processor has determined a relay failure condition exists, the processor is configured to not energize the load until the contactor is reset.

8. The contactor of claim 1, wherein after the processor has determined that a relay failure condition exists, the processor is configured to alert a system controller and/or a user about the relay failure condition.

9. The contactor of claim 1, wherein:
the contactor includes at least one light source; and
the processor is configured to control operation of the at least one light source to illuminate and thereby generate an alert after the processor has determined that a relay failure condition exists.

10. The contactor of claim 1, wherein:
the contactor includes a contact voltage drop monitor electrically connected with the voltage input and voltage output of each said first, second, and third relay, such that the contact voltage drop monitor is operable for monitoring the voltage across each said first, second, and third relay; and
the contact voltage drop monitor is in communication with the processor for providing the processor with information about the voltage drops across the first, second, and third relays.

11. The contactor of claim 1, wherein:
the contactor includes a current monitor electrically connected with the first, second, and third relays; and
the current monitor is in communication with the processor for providing the processor with information about current from the first, second, and third relays to the load.

12. The contactor of claim 1, wherein the processor is configured to keep and compare a cycle count for the first, second, and third relays to a replacement threshold of estimated relay contact cycle life for the connected load level and to generate an alert if the cycle count for the first, second, and third relays equals or exceeds the replacement threshold for the connected load level.

13. The contactor of claim 12, wherein the processor is configured to access replacement thresholds of estimated relay contact cycle life for different load levels to obtain the replacement threshold of estimated relay contact cycle life for the connected load level for comparison to the cycle count.

14. The contactor of claim 12, wherein the processor is configured to control operation of at least one light source to illuminate if the cycle count for the first, second, and third relays equals or exceeds the replacement threshold for the connected load level.

15. A system comprising a controller in communication with the processor of the contactor of claim 1, wherein:
the processor is configured to receive control signals from the controller;
the first, second, and third relays are operable by the processor in response to control signals from the controller to electrically connect or disconnect the load to or from the voltage input received by the contactor from a line voltage source; and
after the processor has determined that a relay failure condition exists, the processor is configured to send an alert to the controller about the relay failure condition.

16. A system comprising a thermostat in communication with the processor of the contactor of claim 1, and a compressor including a motor, wherein:
the processor is configured to receive control signals from the thermostat;
the first, second, and third relays are operable by the processor in response to control signals from the thermostat to electrically connect or disconnect the motor of the compressor to or from the voltage input received by the contactor from a line voltage source; and
after the processor has determined that a relay failure condition exists, the processor is configured to send an alert to the thermostat about the relay failure condition.

17. A contactor comprising:
a processor; and
first, second, and third relays including respective first, second, and third relay contacts and configured to be operable by the processor to electrically connect or disconnect a load to or from a voltage input;
wherein the processor is configured to determine a relay failure condition when:
after the first, second, and third relays are energized, there is no current across at least one of the first, second, and third relays indicating that the at least one of the first, second, and third relays is open and the load is running on two phases; or
after the first, second, and third relays are energized, the current across at least one of the first, second, and third relays is at lock rotor current for more than a predetermined amount of time indicating that the load is running on two phases.

18. The contactor of claim 17, wherein:
the contactor includes at least one current sensor electrically connected with at least one of the first, second, and third relays; and
the at least one current sensor is in communication with the processor for providing the processor with information about current from the at least one of the first, second, and third relays to the load.

19. The contactor of claim 17, wherein:
the contactor includes first, second, and third current sensors electrically connected with the respective first, second, and third relays; and
the first, second, and third current sensors are in communication with the processor for providing the processor with information about current from the first, second, and third relays to the load.

20. The contactor of claim 17, wherein after the processor has determined a relay failure condition exists, the processor is configured to de-energize the load and not energize the load until the contactor is reset.

21. A method of providing adaptive data-based preventive maintenance alerting, the method comprising:
maintaining a cycle count for at least one relay of a contactor;
comparing the cycle count for the at least one relay with a replacement threshold of estimated relay contact cycle life for a connected load level of the at least one relay; and
generating an alert if it is determined that the cycle count for the at least one relay equals or exceeds the replacement threshold of estimated relay contact cycle life for the connected load level of the at least one relay;
wherein:
the at least one relay of the contactor comprises first, second, and third relays configured to be operable by a processor of the contactor to electrically connect or disconnect a load to or from a voltage input; and the method includes:

maintaining and comparing, via the processor, a cycle count for the first, second, and third relays to a replacement threshold of estimated relay contact cycle life for the connected load level; and generating, via the processor, an alert if it is determined that the cycle count for the first, second, and third relays equals or exceeds the replacement threshold of estimated relay contact cycle life for the connected load level.

22. The method of claim 21, wherein the method includes accessing, via the processor, replacement thresholds of estimated relay contact cycle life for different load levels to thereby obtain the replacement threshold of estimated relay contact cycle life for the connected load level for comparison to the cycle count.

23. A method of providing adaptive data-based preventive maintenance alerting, the method comprising:

maintaining a cycle count for at least one relay of a contactor;

comparing the cycle count for the at least one relay with a replacement threshold of estimated relay contact cycle life for a connected load level of the at least one relay; and generating an alert if it is determined that the cycle count for the at least one relay equals or exceeds the replacement threshold of estimated relay contact cycle life for the connected load level of the at least one relay;

wherein the method includes empirically developing estimated relay contact cycle life for multiple inductive load levels.

24. A method of providing adaptive data-based preventive maintenance alerting, the method comprising:

maintaining a cycle count for at least one relay of a contactor;

comparing the cycle count for the at least one relay with a replacement threshold of estimated relay contact cycle life for a connected load level of the at least one relay; and generating an alert if it is determined that the cycle count for the at least one relay equals or exceeds the replacement threshold of estimated relay contact cycle life for the connected load level of the at least one relay;

wherein generating an alert comprises sending an alert to a thermostat if it is determined that the cycle count for the at least one relay equals or exceeds the replacement threshold of estimated relay contact cycle life for the connected load level of the at least one relay.

25. The method of claim 21, wherein generating an alert comprises controlling operation of at least one light source to illuminate if it is determined that the cycle count for the at least one relay equals or exceeds the replacement threshold of estimated relay contact cycle life for the connected load level of the at least one relay.

26. A method of providing adaptive data-based preventive maintenance alerting, the method comprising:

maintaining a cycle count for at least one relay of a contactor;

comparing the cycle count for the at least one relay with a replacement threshold of estimated relay contact cycle life for a connected load level of the at least one relay; and generating an alert if it is determined that the cycle count for the at least one relay equals or exceeds the replacement threshold of estimated relay contact cycle life for the connected load level of the at least one relay;

wherein the method includes providing adaptive data-based preventive maintenance contactor replacement alerting that is independent from and/or not solely based on specific time intervals according to a replacement schedule.

27. A contactor comprising:

a processor; and first, second, and third relays including respective first, second, and third relay contacts and configured to be operable by the processor to electrically connect or disconnect a load to or from a voltage input;

wherein the processor is configured to:

maintain and compare a cycle count for the first, second, and third relays to a replacement threshold of estimated relay contact cycle life for a connected load level; and generate an alert if it is determined that the cycle count for the first, second, and third relays equals or exceeds the replacement threshold of estimated relay contact cycle life for the connected load level.

28. The contactor of claim 27, wherein the processor is configured to access replacement thresholds of estimated relay contact cycle life for different load levels to thereby obtain the replacement threshold of estimated relay contact cycle life for the connected load level for comparison to the cycle count.

29. The contactor of claim 27 wherein the processor is configured to empirically develop estimated relay contact cycle life for multiple inductive load levels.

30. The contactor of claim 27, wherein the contactor is configured to be operable for providing adaptive data-based preventive maintenance contactor replacement alerting that is independent from and/or not solely based on specific time intervals according to a replacement schedule.

31. A system comprising a controller in communication with the processor of the contactor of claim 27, wherein:

the processor is configured to receive control signals from the controller;

the first, second, and third relays are operable by the processor in response to control signals from the controller to electrically connect or disconnect the load to or from the voltage input received by the contactor from a line voltage source; and the processor is configured to send an alert to the controller if the processor determines that the cycle count for the first, second, and third relays equals or exceeds the replacement threshold of estimated relay contact cycle life for the connected load level.

32. A system comprising a thermostat in communication with the processor of the contactor of claim 27, and a compressor including a motor, wherein:

the processor is configured to receive control signals from the thermostat;

the first, second, and third relays are operable by the processor in response to control signals from the thermostat to electrically connect or disconnect the motor of the compressor to or from the voltage input received by the contactor from a line voltage source; and the processor is configured to send an alert to the thermostat if the processor determines that the cycle count for the first, second, and third relays equals or exceeds the replacement threshold of estimated relay contact cycle life for the connected load level.

\* \* \* \* \*